United States Patent
Classen et al.

(10) Patent No.: US 9,040,336 B2
(45) Date of Patent: May 26, 2015

(54) METHOD FOR MANUFACTURING A CAP FOR A MEMS COMPONENT, AND HYBRID INTEGRATED COMPONENT HAVING SUCH A CAP

(71) Applicants: Johannes Classen, Reutlingen (DE); Axel Franke, Wannweil (DE); Jens Frey, Filderstadt (DE); Heribert Weber, Nuertingen (DE); Frank Fischer, Gomaringen (DE); Patrick Wellner, Walddorfhaeslach (DE)

(72) Inventors: Johannes Classen, Reutlingen (DE); Axel Franke, Wannweil (DE); Jens Frey, Filderstadt (DE); Heribert Weber, Nuertingen (DE); Frank Fischer, Gomaringen (DE); Patrick Wellner, Walddorfhaeslach (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/058,806

(22) Filed: Oct. 21, 2013

(65) Prior Publication Data

US 2014/0110800 A1    Apr. 24, 2014

(30) Foreign Application Priority Data

Oct. 24, 2012  (DE) .......................... 10 2012 219 465

(51) Int. Cl.
- *H01L 21/00* (2006.01)
- *B81C 1/00* (2006.01)
- *B81B 3/00* (2006.01)
- *B81B 7/00* (2006.01)

(52) U.S. Cl.
CPC ........... *B81C 1/00015* (2013.01); *B81B 3/0018* (2013.01); *B81B 7/0058* (2013.01)

(58) Field of Classification Search
CPC ............. G01P 15/14; B81B 3/00; B81B 7/00; B81C 1/00
USPC .................. 438/50; 257/415, 418; 73/504.02
See application file for complete search history.

(56) References Cited

U.S. PATENT DOCUMENTS

| | | | |
|---|---|---|---|
| 8,729,646 B2 * | 5/2014 | Chu et al. ........................ | 257/415 |
| 8,754,529 B2 * | 6/2014 | Chien et al. .................... | 257/770 |
| 2007/0017287 A1 * | 1/2007 | Kubena et al. .............. | 73/504.02 |
| 2007/0259471 A1 * | 11/2007 | Li et al. ............................. | 438/50 |
| 2011/0049652 A1 * | 3/2011 | Wu et al. ........................ | 257/417 |
| 2011/0175180 A1 * | 7/2011 | Jiao et al. ....................... | 257/418 |
| 2012/0129291 A1 * | 5/2012 | Stahl et al. ........................ | 438/50 |
| 2012/0133003 A1 * | 5/2012 | Reinmuth ....................... | 257/415 |
| 2012/0205753 A1 * | 8/2012 | Adams et al. .................. | 257/415 |
| 2012/0286378 A1 * | 11/2012 | Lee ................................. | 257/415 |
| 2013/0043510 A1 * | 2/2013 | Shu et al. ....................... | 257/254 |
| 2013/0069177 A1 * | 3/2013 | Wang et al. ..................... | 257/415 |
| 2013/0270658 A1 * | 10/2013 | Behrendt et al. .............. | 257/415 |
| 2013/0334621 A1 * | 12/2013 | Classen et al. ................. | 257/415 |

(Continued)

*Primary Examiner* — Caleb Henry
(74) *Attorney, Agent, or Firm* — Kenyon & Kenyon LLP (57) ABSTRACT

A manufacturing method for a cap, for a hybrid vertically integrated component having a MEMS component a relatively large cavern volume having a low cavern internal pressure, and a reliable overload protection for the micromechanical structure of the MEMS component. A cap structure is produced in a flat cap substrate in a multistep anisotropic etching, and includes at least one mounting frame having at least one mounting surface and a stop structure, on the cap inner side, having at least one stop surface, the surface of the cap substrate being masked for the multistep anisotropic etching with at least two masking layers made of different materials, and the layouts of the masking layers and the number and duration of the etching steps being selected so that the mounting surface, the stop surface, and the cap inner side are situated at different surface levels of the cap structure.

6 Claims, 6 Drawing Sheets

(56) References Cited

U.S. PATENT DOCUMENTS

2013/0334627 A1* 12/2013 Conti et al. .................. 257/416
2013/0341738 A1* 12/2013 Reinmuth et al. ............ 257/415
2014/0042562 A1* 2/2014 Chu et al. ..................... 257/415
2014/0117475 A1* 5/2014 Classen et al. ............... 257/418

* cited by examiner

METHOD FOR MANUFACTURING A CAP FOR A MEMS COMPONENT, AND HYBRID INTEGRATED COMPONENT HAVING SUCH A CAP

RELATED APPLICATION INFORMATION

The present application claims priority to and the benefit of German patent application no. 10 2012 219 465.7, which was filed in Germany on Oct. 24, 2012, the disclosure of which is incorporated herein by reference.

FIELD OF THE INVENTION

The present invention relates to a method for manufacturing a cap for a MEMS component having at least one structural element which is deflectable perpendicularly with respect to the component plane. Moreover, the present invention relates to a method for manufacturing hybrid integrated components which include an ASIC component, a MEMS component, and a cap manufactured according to the present invention, as well as such a hybrid integrated component.

BACKGROUND INFORMATION

United States patent document 2011/0049652 A1 discusses a vertically integrated component of this type and a method for its manufacture. The known method provides that the starting substrate for the MEMS component is bonded to an ASIC substrate which is already processed and optionally also structured. Only then is a micromechanical structure produced in the MEMS substrate. A cap wafer is independently structured and prepared for the mounting above the micromechanical structure of the MEMS substrate and on the ASIC. After the MEMS substrate is structured, the cap wafer processed in this way is bonded to the ASIC substrate, so that the micromechanical structure is hermetically sealed in a cavern between the ASIC substrate and the cap wafer.

The known method allows cost-effective mass production of robust components having a micromechanical sensor or actuator function, and an evaluation or control circuit, since in this case not only are the individual components (ASIC component, MEMS component, and cap) produced in the wafer composite, but in addition their mounting on a sensor component or actuator component on the wafer plane is achieved. The MEMS functions and the ASIC functions may be tested on the wafer plane, and the individual components may even be compared on the wafer plane. The stacked configuration of the known components likewise contributes to a reduction in the manufacturing costs, since these components require only a comparatively small mounting surface in the second-level mounting.

The cap wafer already protects the micromechanical structures of the individual MEMS components from soiling and damage during the further processing of the wafer stack. Thus, for example, particles which arise during sawing of the wafer stack for separation of the components are not able to settle in the micromechanical structures of the MEMS substrate. In a molding process for packaging the components, the cap prevents the molding compound from penetrating into the micromechanical structure of the MEMS component and impairing its functionality. In addition, the risk of component damage during the second-level mounting is significantly reduced by the cap, since the sensitive micromechanical structure of the component is not freely accessible, but, rather, is enclosed in the cavern between the cap and the ASIC component.

As a result of this encapsulation, the micromechanical structure of the MEMS component protects against soiling, moisture, and other environmental influences which impair functioning, even after manufacture and mounting of the component at the point of use.

With the aid of the cap, in addition a certain damping behavior which is coordinated with the type of component or its function may be specified and ensured over the service life of the component. For acceleration sensors, a critical damping behavior, for example, is usually sought, while yaw rate sensors require a high quality. For this purpose, the cavern internal pressure should be as low as possible.

This requirement may be met only with a sufficiently large cavern volume, since a certain degree of outgassing always occurs at the cavern wall and the MEMS surfaces within the cavern. Consequently, the distance between the cap cover and the micromechanical structure or the ASIC component must be appropriately large.

For capacitively operating MEMS components, there is another reason to select the distance between the cap cover and the micromechanical structure to be not too small, namely, the electrostatic influences of the cap on the electrical fields at the capacitors of the MEMS component. If the cap is situated too close to the micromechanical structure, the electrical fields of the capacitors of the MEMS component are deformed, which in the case of a sensor element affects the measuring signal, and in the case of an actuator element affects the control.

For both of the above-mentioned functions, i.e., protecting the micromechanical structure against soiling and adverse environmental influences, and ensuring a defined damping behavior of the micromechanical structure of the MEMS component, the cap may also still function as overload protection for the deflectable structural element of the MEMS component. Very high stresses on the micromechanical structure may occur, for example, if the component is dropped or subjected to impacts during the mounting process. This may result in excessive deflection of individual structural elements from the component plane, and may even result in catching and breaking within the micromechanical structure. Such damage may be avoided with the aid of an overload protection which limits the deflection of the micromechanical structure from the component plane.

SUMMARY OF THE INVENTION

The present invention further develops the component configuration from US 2011/0049652 A1. In particular, a manufacturing method for a cap is proposed via which, within the scope of the known hybrid vertically integrated component configuration, a relatively large cavern volume with a low cavern internal pressure as well as a reliable overload protection for the micromechanical structure of the MEMS component may be achieved.

According to the present invention, for this purpose a flat cap substrate is structured in a multistep anisotropic etching process in order to produce a cap structure which includes at least one mounting frame having at least one mounting surface and a stop structure on the cap inner side having at least one stop surface. For this multistep anisotropic etching process, the surface of the cap substrate is masked with at least two masking layers made of different materials. According to the present invention, the layouts of the masking layers and the number and duration of the etching steps are selected in such a way that the mounting surface, the stop surface, and the cap inner side are situated at different surface levels of the cap structure.

A multistep anisotropic etching process opens the possibility of producing trench structures of different depths in a flat substrate. This is utilized according to the present invention in order to produce a stop structure on the cap inner side, whose height is independent of the height of the mounting frame, and thus independent of the height of the cap. As a result, with the aid of the cap shape produced according to the present invention, hybrid vertically integrated components having a comparatively large cavern volume may be implemented in which the out-of-plane deflection of the micromechanical structure of the MEMS component is limited to a noncritical degree by the stop structure on the cap inner side. This cap shape is therefore particularly suited for hybrid vertically integrated inertial sensor components.

Based on the variety of applications of a cap manufactured according to the present invention, there are numerous advantageous embodiment variants of the manufacturing method according to the present invention. To this end, reference is made on the one hand to the further descriptions herein, and on the other hand to the following description of two exemplary embodiments of the present invention, with reference to the figures.

DETAILED DESCRIPTION

Figure 1A:
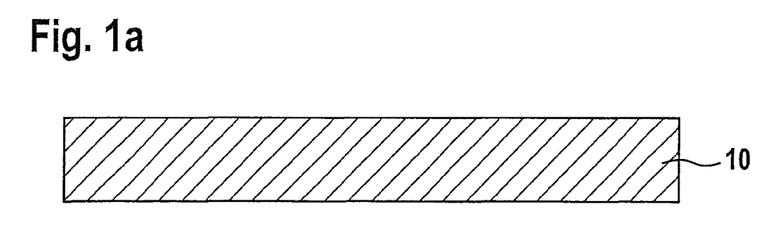
FIGS. 1a, 1b, 1c, 1d, and 1e show, with reference to schematic sectional illustrations, a first method variant according to the present invention for manufacturing a cap for a hybrid integrated component having a MEMS component and an ASIC component.

FIG. 1a shows a silicon wafer 10 as a starting substrate for the manufacturing variant illustrated in FIGS. 1a through 1e.

Figure 1B:
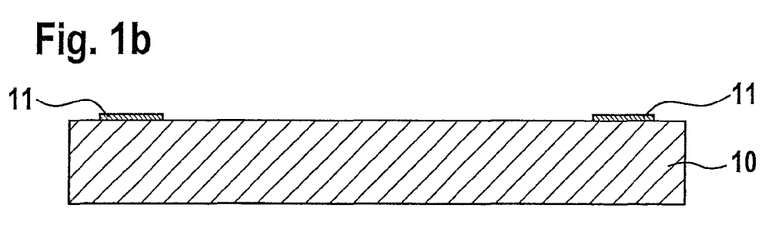

The mounting surface of the cap yet to be manufactured is defined in a first method step. For this purpose, a connecting material 11 is initially flatly applied to the substrate surface and then structured in such a way that connecting material 11 remains only in the area of a circumferential mounting frame on the substrate surface. If the cap is to be mounted in a bonding process, germanium (Ge), for example, may be used as the connecting material. The result of this first method step is illustrated in FIG. 1b.

Figure 1C:
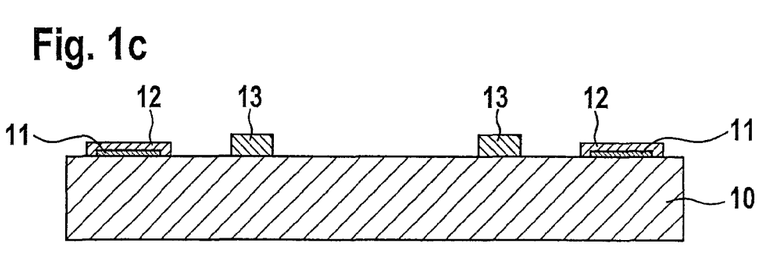

An oxide layer 12 as a first masking layer is subsequently applied to the substrate surface and structured. In the exemplary embodiment illustrated here, this first masking layer 12 is used solely for protecting the circumferential mounting frame having mounting surface 11. Masking layer 12 is completely removed from the remaining areas of the substrate surface before a resist mask 13 as a second masking layer is applied to the substrate surface. A stop structure is defined on the cap inner side with the aid of resist mask 13. Thus, in the exemplary embodiment illustrated here, the positions and the lateral extension of column-like stops are established, as illustrated by FIG. 1c.

Figure 1D:
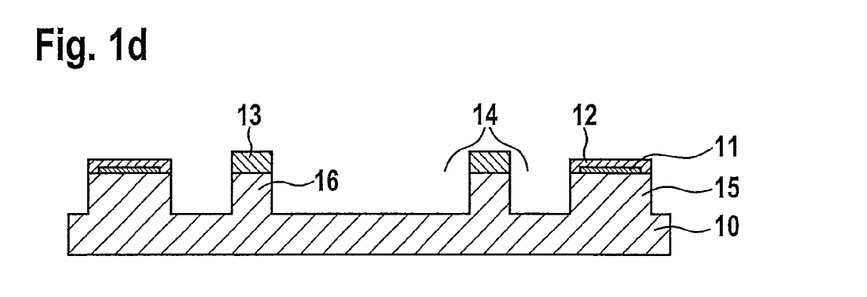

Trench structures 14 are now produced in the unmasked areas of the substrate surface in a first anisotropic etching step. The cavern in the cap is formed, at least up to the etching depth of the first etching step, and the upper sections of mounting frame 15 and of column-like stops 16 are exposed. The result of this first anisotropic etching step is illustrated in FIG. 1d.

Figure 1E:
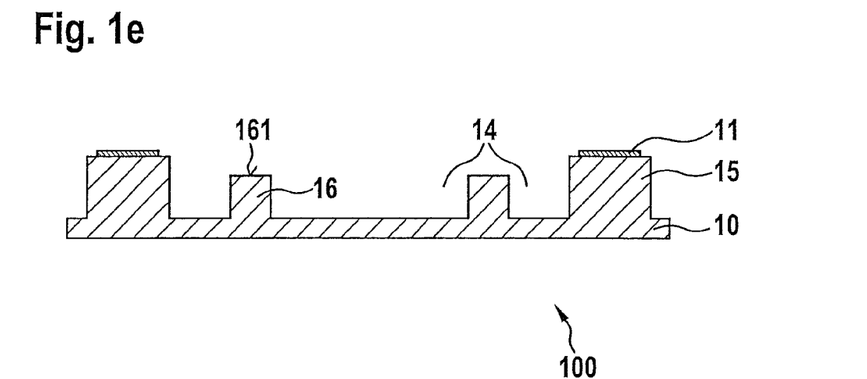

Resist mask 13 is now removed from stops 16 prior to a second anisotropic etching step, while oxide mask 12 remains on mounting frame 15. Accordingly, only trench structures 14 are deepened during the second etching attack. In the process, it is important that column-like stops 16 are also thinned to a defined height, which is determined by the duration of the second etching attack. In this way, stop surfaces 161 are produced at a surface level which is situated at a predefinable distance from the surface level of mounting surface 11 of cap 100. FIG. 1e shows a cap 100 as a result of the above-described structuring process after oxide layer 12 has also been removed from mounting frame 15.

FIGS. 2a through 2h illustrate one advantageous variant of the above-described two-mask process which offers greater design flexibility. A silicon wafer 20 is once again used as the starting substrate in this method variant.

Figure 2A:
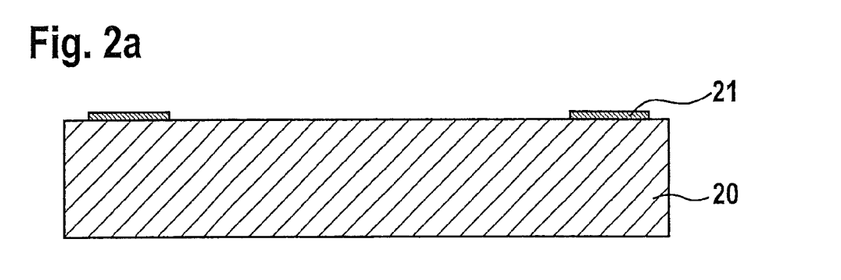
FIGS. 2a, 2b, 2c, 2d, 2e, 2f, 2g, and 2h show, likewise with reference to schematic sectional illustrations, a second manufacturing variant for this type of cap.

FIG. 2a shows silicon wafer 20 after the separation and structuring of a connecting layer as a bonding frame 21 made of Ge, for example. Bonding frame 21 forms the mounting surface on the circumferential mounting frame of the cap yet to be manufactured.

Figure 2B:
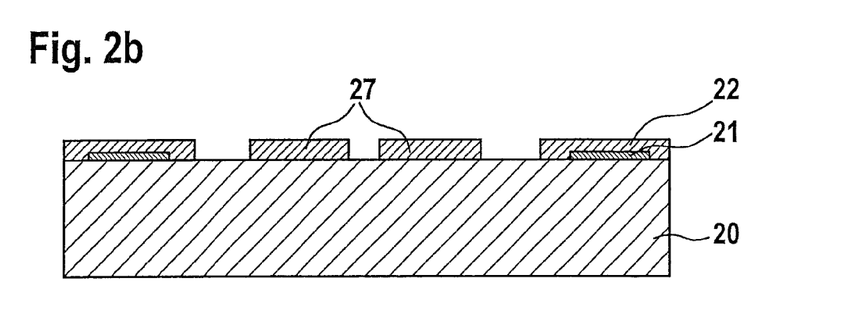

The same as in the case of silicon wafer 10, an oxide layer 22 is now applied to the substrate surface as the first masking layer and structured. However, in the present case this first masking layer 22 is not just used for protecting circumferential bonding frame 21. In addition to bonding frame 21, a further area 27 of the substrate surface within bonding frame 21 is masked with first masking layer 22, as illustrated in FIG. 2b. This further area 27 is ring-shaped in the exemplary embodiment illustrated here, but may also have other shapes.

Figure 2C:
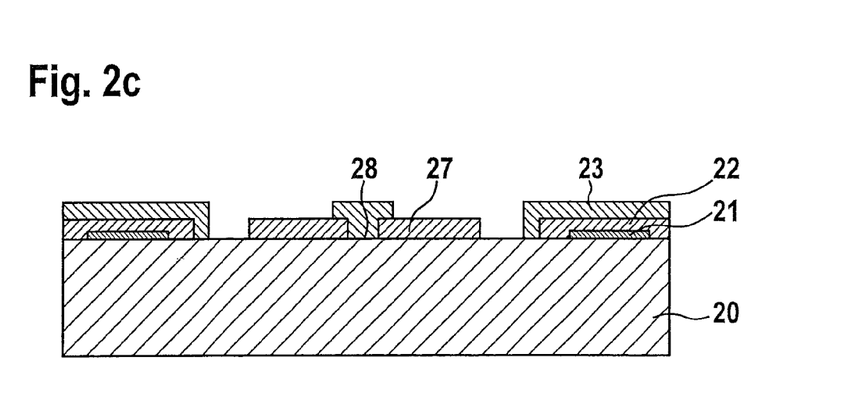

A resist mask 23 is subsequently applied as the second masking layer. FIG. 2c shows that the two masking layers 22 and 23 overlap in places, in particular at least in the area of the mounting frame. However, with the aid of resist mask 23 a substrate area 28 in the center of ring-shaped substrate area 27, where a column-like stop is to be exposed, is also masked.

Figure 2D:
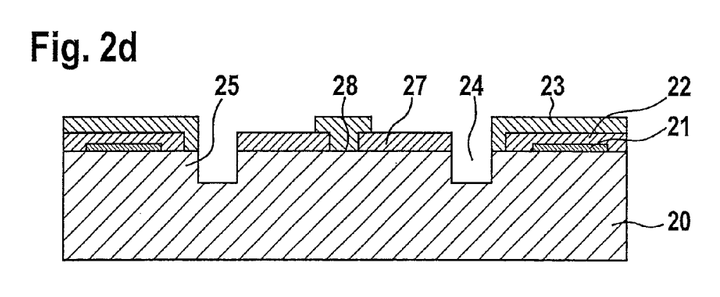
Figure 2E:
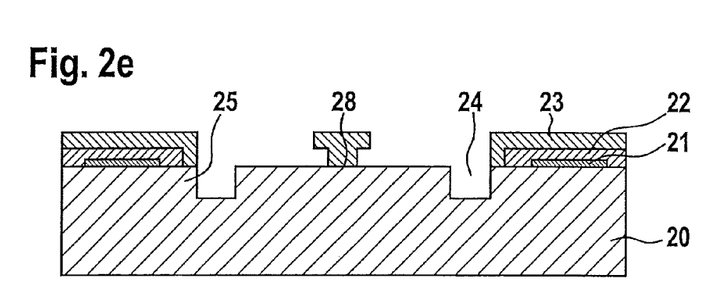

A trench structure 24 is produced in the unmasked areas of the substrate surface in the first anisotropic etching step which now follows. The upper section of mounting frame 25 is exposed, at least up to the etching depth of the first etching step. The result of this first anisotropic etching step is illustrated in FIG. 2d.

The areas of first masking layer 22 which are not protected by resist mask 23 are now removed prior to a second anisotropic etching step. As is apparent from FIG. 2e, in particular ring-shaped area 27 of the substrate surface is thus exposed.

Figure 2F:
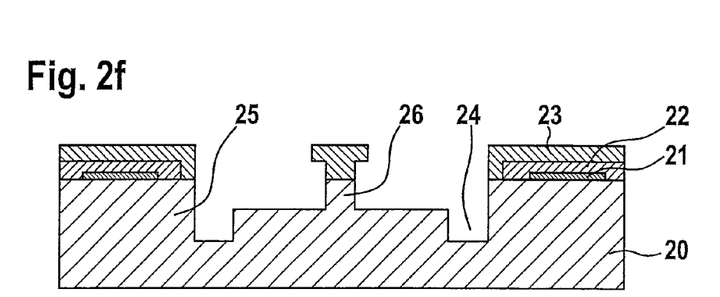

FIG. 2f shows silicon substrate 20 after the second etching attack. On the one hand trench structure 24 has been deepened, and on the other hand substrate material has been removed from ring-shaped area 27 within mounting frame 25. A column-like stop 26 has thus been exposed in the middle area of trench structure 24 produced in this way.

Figure 2G:
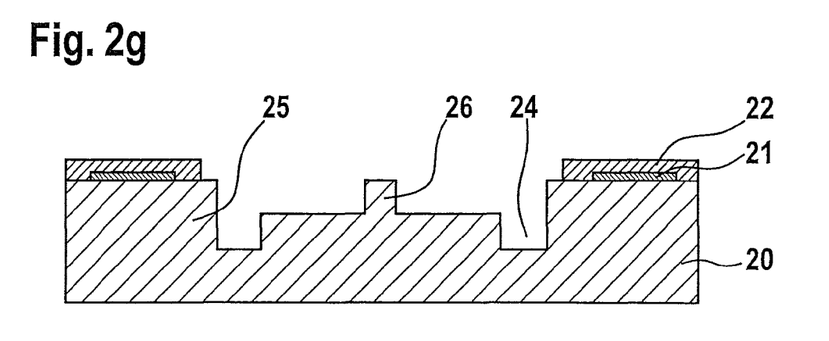

Resist mask 23 is now removed from the structured substrate surface and in particular from stop 26 in a further method step, the result of which is illustrated in FIG. 2g. Afterwards, only bonding frame 21 is still protected, in particular by the remaining areas of first masking layer 22, against a further etching attack.

Figure 2H:
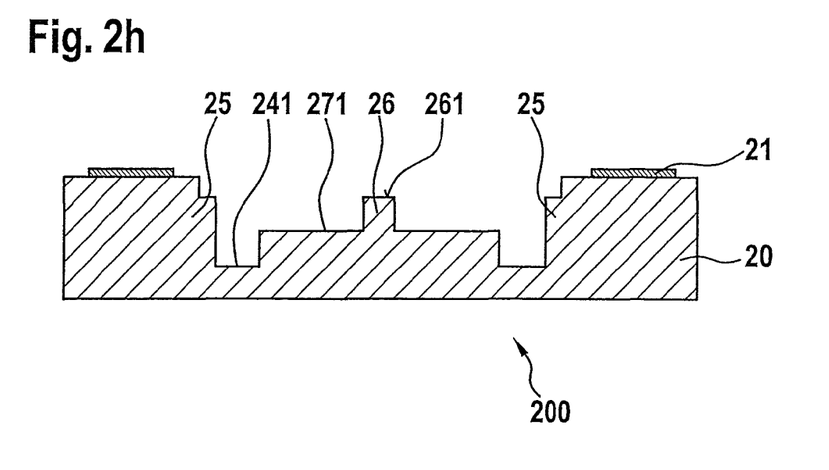

Trench structure 24 is then once again deepened overall in the subsequent third etching attack, the trench profile which has already been produced being retained. In addition, column-like stop 26 is thinned to a defined height. FIG. 2h shows a cap 200 as a result of this structuring process after the remaining areas of first masking layer 22 have been removed and bonding frame 21 has been exposed. In this case, the cap structure or the trench profile even includes at least three different surface levels in addition to the level of bonding frame 21, namely, the level of stop surface 261 of column-like stop 26, level 271 in area 27 which annularly surrounds stop 26, and level 241 in area 24 surrounding this area 27, which is primarily responsible for the size of the cavern volume beneath cap 200.

Figure 3:
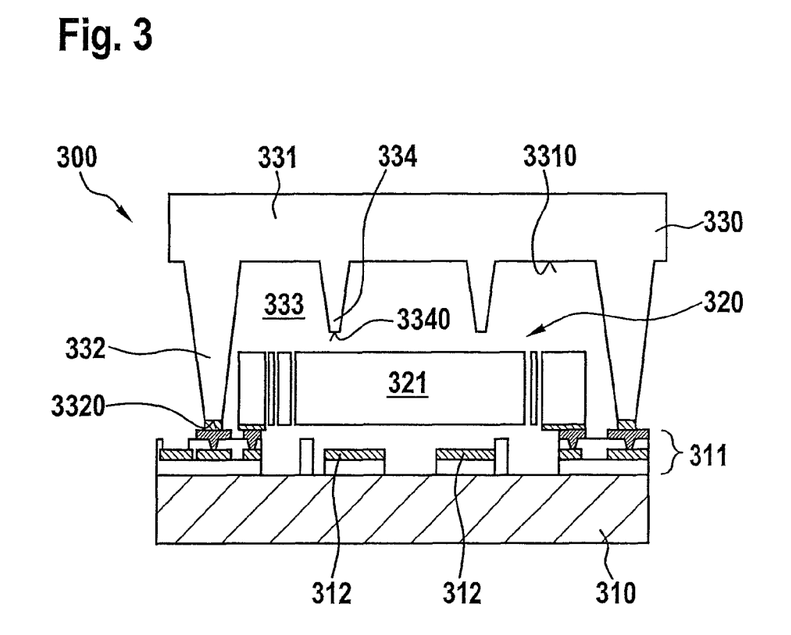
FIG. 3 shows a schematic sectional illustration of a hybrid integrated component having an ASIC component, a MEMS component, and a cap manufactured according to the present invention.

The illustration of a hybrid vertically integrated inertial sensor component 300 in FIG. 3 shows the advantages of a cap manufactured according to the present invention.

Component 300 includes an ASIC component 310 into which at least portions of an evaluation circuit for the sensor function are integrated. Two stationary electrodes 312 of a capacitor system for signal detection are formed in back-end stack 311 of ASIC component 310. A MEMS component 320 is mounted on ASIC component 310, above this electrode system 312 and at a distance from back-end stack 311. The micromechanical structure of this MEMS component 320 extends over its entire thickness, and includes an elastically suspended seismic mass 321 which is perpendicularly deflectable with respect to the component plane. Seismic mass 321 functions as a deflectable electrode of the capacitor system, so that deflections of seismic mass 321 cause a change in capacitance of the capacitor system and may be detected as such. Lastly, component 300 also includes a cap 330 which is mounted on ASIC component 310 in a hermetically sealed manner above MEMS component 320. Accordingly, the micromechanical structure of MEMS component 320 is enclosed within a cavern 333 between cap 330 and ASIC component 310 under defined pressure conditions.

Cap 330 is implemented in the form of a structured flat cap substrate, and is composed essentially of a cap cover 331 having a circumferential mounting frame 332. Mounting frame 332 protrudes perpendicularly from cap cover 331, and thus determines the distance between the ASIC surface or the MEMS structure and cap cover 331, and therefore also the size of cavern 333. A stop structure for seismic mass 321 of MEMS component 320 is formed on cap inner side 3310. The stop structure is implemented in the form of two column-like stops 334 which are situated in the area of seismic mass 321 and protrude into the interior of cavern 333.

It is important that mounting surface 3320 on mounting frame 332, stop surfaces 3340 on column-like stops 334, and cap inner side 3310 are situated at different surface levels. A comparatively large cavern volume, and thus also a low cavern internal pressure, if needed, may thus be achieved, while the deflections of seismic mass 321 are limited to a noncritical degree with the aid of stops 334. Electrostatic interactions between the cap structure and the MEMS or ASIC component, which impair the capacitive signal detection appreciably, do not occur here, since stop surfaces 3340 are only comparatively small and the distance from cap cover 331 is sufficiently large.

Hybrid vertically integrated component 300 illustrated here is advantageously manufactured in large quantities in the wafer composite. For this purpose, an ASIC substrate is initially processed in order to produce the functionality of a plurality of ASIC components situated in a grid. A MEMS substrate is then mounted on the processed front side of the ASIC substrate. The structuring of this MEMS substrate is carried out only after it is mounted on the ASIC substrate. The micromechanical structure of a MEMS component is produced above each ASIC component. This micromechanical structure extends over the entire thickness of the MEMS substrate. A cap substrate is independently structured in the grid of the ASIC components and MEMS components, in particular as described in conjunction with FIG. 1 or 2, for example. The cap substrate structured in this way is then mounted on the ASIC substrate above the grid of the MEMS components. Only then are the components separated.

What is claimed is:

1. A method for manufacturing a cap for a MEMS component having at least one structural element which is deflectable perpendicularly with respect to the component plane, the method comprising:
    producing a cap structure in a flat cap substrate in a multistep anisotropic etching process, the cap structure including at least one mounting frame having at least one mounting surface and a stop structure, on the cap inner side, having at least one stop surface;
    masking a surface of the cap substrate for the multistep anisotropic etching process with at least two masking layers made of different materials; and
    selecting layouts of the at least two masking layers and a number and a duration of the etching steps so that the mounting surface, the stop surface, and the cap inner side are situated at different surface levels of the cap structure;
wherein:
    at least one connecting layer is applied on a flat cap substrate and structured,
    at least one first masking layer is applied on the substrate surface above the structured connecting layer,
    at least one second masking layer is then applied and structured, and
    trench structures which define at least one area of the cavern beneath the cap are produced in the unmasked area of the substrate surface in a first anisotropic etching step, and are deepened in a second anisotropic etching step.

2. The method of claim 1, wherein a silicon substrate is used as the cap substrate.

3. The method of claim 1, wherein at least one oxide layer and at least one resist layer are applied as masking layers to the cap substrate and structured independently of one another.

4. A method for manufacturing a cap for a MEMS component having at least one structural element which is deflectable perpendicularly with respect to the component plane, the method comprising:
    producing a cap structure in a flat cap substrate in a multistep anisotropic etching process, the cap structure including at least one mounting frame having at least one mounting surface and a stop structure, on the cap inner side, having at least one stop surface;
    masking a surface of the cap substrate for the multistep anisotropic etching process with at least two masking layers made of different materials; and
    selecting layouts of the at least two masking layers and a number and a duration of the etching steps so that the mounting surface, the stop surface, and the cap inner side are situated at different surface levels of the cap structure;
wherein:
    at least one connecting layer is applied on a flat cap substrate and structured, at least one mounting surface for the cap being defined,
    at least one first masking layer which masks at least the mounting surface is applied on the substrate surface above the structured connecting layer and structured,
    at least one second masking layer which defines at least one stop structure is then applied and structured, trench structures which define at least one area of the cavern beneath the cap are produced in the unmasked area of the substrate surface in a first anisotropic etching step, the second masking layer is subsequently removed from the stop structure, the trench structures already produced are deepened in a second anisotropic etching step, the stop structure also now being thinned to a defined height, and lastly, the first masking layer is also removed.

5. A method for manufacturing a cap for a MEMS component having at least one structural element which is deflectable perpendicularly with respect to the component plane, the method comprising:

producing a cap structure in a flat cap substrate in a multi-step anisotropic etching process, the cap structure including at least one mounting frame having at least one mounting surface and a stop structure, on the cap inner side, having at least one stop surface;

masking a surface of the cap substrate for the multistep anisotropic etching process with at least two masking layers made of different materials; and selecting layouts of the at least two masking layers and a number and a duration of the etching steps so that the mounting surface, the stop surface, and the cap inner side are situated at different surface levels of the cap structure;

wherein:

at least one connecting layer is applied on a flat cap substrate and structured, at least one mounting surface for the cap being defined, at least one first masking layer which masks the mounting surface and at least one substrate area in the area of the cavern is applied on the substrate surface above the structured connecting layer and structured, at least one second masking layer is then applied and structured, at least the mounting surface being masked and a stop structure being defined, trench structures which define at least one area of the cavern beneath the cap are produced in the unmasked areas of the substrate surface in a first anisotropic etching step, the unmasked areas of the first masking layer are removed after the first etching step, the existing trench structures are deepened, and extended into the areas which are now no longer masked, in a second anisotropic etching step, the second masking layer is completely removed and is also removed from the stop structure, the trench structures already produced are deepened in a third anisotropic etching step, the stop structure now also being thinned to a defined height, and lastly, the first masking layer is also completely removed.

6. A method for manufacturing hybrid integrated components at least including one ASIC component, one MEMS component, and one cap, the method comprising:

initially processing an ASIC substrate to produce the functionality of a plurality of ASIC components situated in a grid;

mounting a MEMS substrate on the processed front side of the ASIC substrate, the mounted MEMS substrate being structured, the micromechanical structure of a MEMS component, which extends over the entire thickness of the MEMS substrate, being produced above each ASIC component;

structuring a cap substrate in the grid of the ASIC components and MEMS components; and mounting the cap substrate on the ASIC substrate above the grid of the MEMS components, and only then are the components separated;

wherein the cap, which is for the MEMS component having at least one structural element which is deflectable perpendicularly with respect to the component plane, is made by performing the following:

producing a cap structure in a flat cap substrate in a multistep anisotropic etching process, the cap structure including at least one mounting frame having at least one mounting surface and a stop structure, on the cap inner side, having at least one stop surface;

masking a surface of the cap substrate for the multistep anisotropic etching process with at least two masking layers made of different materials; and selecting layouts of the at least two masking layers and a number and a duration of the etching steps so that the mounting surface, the stop surface, and the cap inner side are situated at different surface levels of the cap structure.

* * * * *